(12) United States Patent
Okuyama et al.

(10) Patent No.: US 10,209,277 B2
(45) Date of Patent: Feb. 19, 2019

(54) CURRENT SENSOR

(71) Applicant: Hitachi Metals, Ltd., Tokyo (JP)

(72) Inventors: Ken Okuyama, Hitachi (JP); Katsuya Akimoto, Mito (JP); Naoki Futakuchi, Hitachinaka (JP); Jun Umetsu, Hitachi (JP); Yujiro Tomita, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/634,394

(22) Filed: Jun. 27, 2017

(65) Prior Publication Data

US 2017/0370969 A1    Dec. 28, 2017

(30) Foreign Application Priority Data

Jun. 28, 2016   (JP) .................................. 2016-127864

(51) Int. Cl.
*G01R 15/20*   (2006.01)
*G01R 33/09*   (2006.01)

(52) U.S. Cl.
CPC .......... *G01R 15/205* (2013.01); *G01R 33/093* (2013.01)

(58) Field of Classification Search
CPC ................................................. G01R 15/205
See application file for complete search history.

(56) References Cited

U.S. PATENT DOCUMENTS

| 7,583,072 | B2 | 9/2009 | Muraki et al. |
| 2007/0200551 | A1 | 8/2007 | Muraki et al. |
| 2017/0219634 | A1* | 8/2017 | Shimizu ............... G01R 15/205 |

FOREIGN PATENT DOCUMENTS

JP    4612554 B2    1/2011

* cited by examiner

*Primary Examiner* — Clayton E Laballe
*Assistant Examiner* — Jas Sanghera
(74) *Attorney, Agent, or Firm* — McGinn IP Law Group, PLLC.

(57) ABSTRACT

A current sensor includes, a bus bar through which a current flows, a magnetic detection element detecting a magnetic field intensity generated by the current, first and second shielding plates arranged so as to sandwich the bus bar between the first and second shielding plates, a first conductive plate made of a conductive nonmagnetic material, arranged between the bus bar and the first shielding plate, and a second conductive plate made of the conductive nonmagnetic material, arranged between the bus bar and the second shielding plate, wherein the magnetic detection element is arranged at a first conductive plate-side. A distance between the first conductive plate and the bus bar is longer than a distance between the second conductive plate and the bus bar. The first conductive plate includes a slit formed in the first conductive plate at an overlapping position, and the slit pierces the first conductive plate.

8 Claims, 3 Drawing Sheets

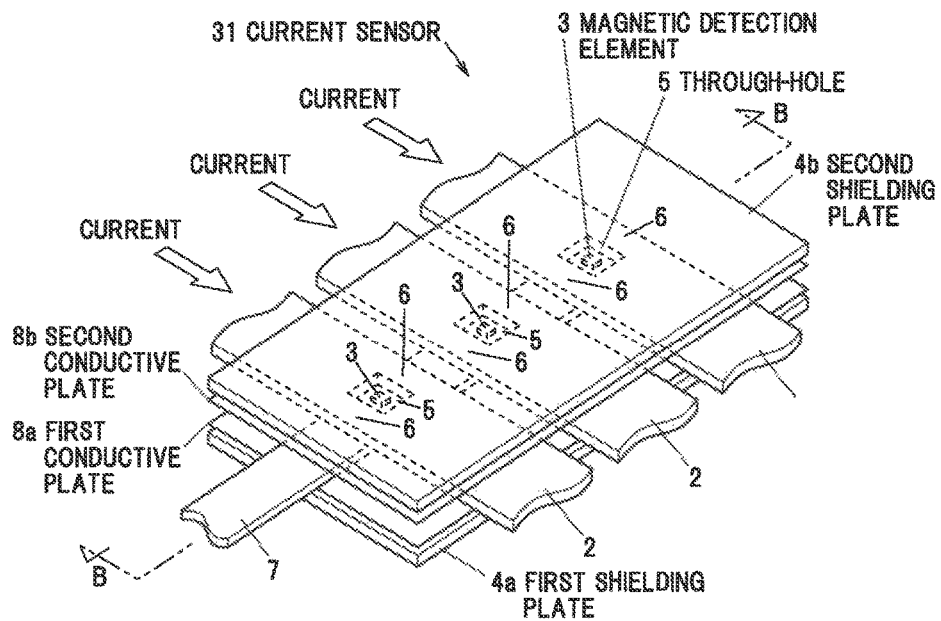
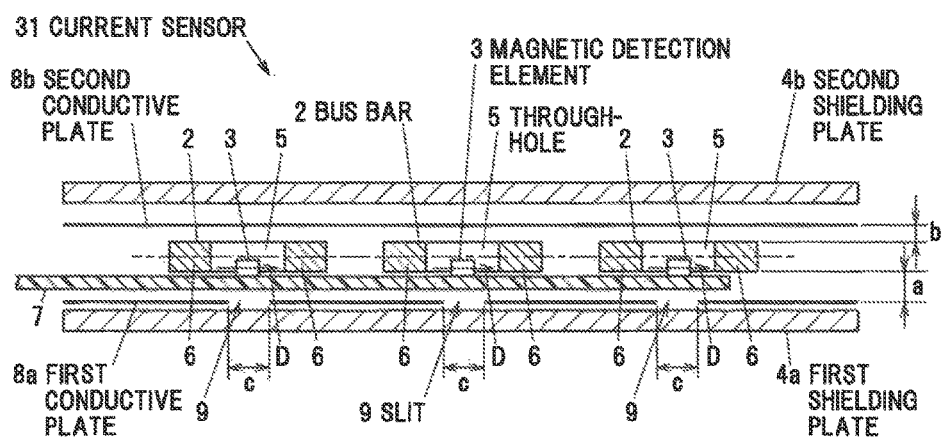

CURRENT SENSOR

The present application is based on Japanese patent application No. 2016-127864 filed on Jun. 28, 2016, the entire contents of which are incorporated herein by reference.

BACKGROUND OF THE INVENTION

1. Field of the Invention

This invention relates to a current sensor.

2. Description of the Related Art

Conventionally, a current sensor including a magnetic detection sensor that detects an intensity of magnetic field generated by electric current as a measuring object has been known (see e.g. Japanese Patent No. 4612554). The electric current as the measuring object can be calculated on the basis of the intensity of magnetic field, which is detected with using a magnetic detection element.

SUMMARY OF THE INVENTION

In the current sensor disclosed by Japanese Patent No. 4612554, however, the current detection accuracy may decrease since the magnetic flux density at a detecting position changes depending on the frequency of the electric current as the measuring object. That is, the conventional current sensor has high frequency dependency.

Accordingly, it is an object of the invention to provide a current sensor which improves, i.e. reduces the frequency dependency.

According to an embodiment of the invention, a current sensor, comprises:

a bus bar through which a current as a measuring object flows;

a magnetic detection element that detects a magnetic field intensity generated by the current flowing in the bus bar;

first and second shielding plates arranged so as to sandwich the bus bar between the first and second shielding plates in a thickness direction of the bus bar;

a first conductive plate comprising a conductive nonmagnetic material, and arranged between the bus bar and the first shielding plate; and a second conductive plate comprising the conductive nonmagnetic material, and arranged between the bus bar and the second shielding plate, wherein the magnetic detection element is arranged closer to a first conductive plate than a center of the bus bar in the thickness direction, wherein a distance between the first conductive plate and the bus bar is longer than a distance between the second conductive plate and the bus bar, and wherein the first conductive plate comprises a slit formed in the first conductive plate at an overlapping position with the magnetic detection element in the thickness direction, and pierces the first conductive plate in a thickness direction of the first conductive plate.

(Points of the Invention)

According to the present invention, it is possible to provide a current sensor which improves, i.e. reduces the frequency dependency.

BRIEF DESCRIPTION OF THE DRAWINGS

Next, the present invention will be explained in conjunction with appended drawings, wherein:

FIG. 3A is a perspective view showing a current sensor according to a variation of the present invention; and FIG. 3B is a cross sectional view showing the current sensor according to the variation of the present invention cut along line B-B in FIG. 3A.

DETAILED DESCRIPTION OF THE EMBODIMENT

[Embodiment]

Next, the embodiment according to the present invention will be described below with reference to the appended drawings.

Figure 1A:
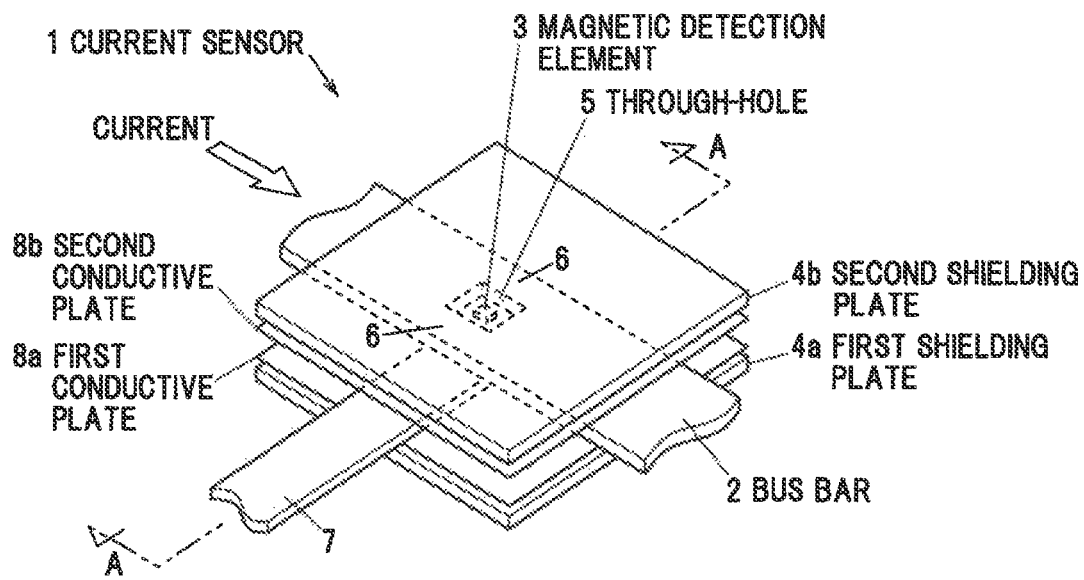
FIG. 1A is a perspective view showing a current sensor in an embodiment according to the present invention.
Figure 1B:
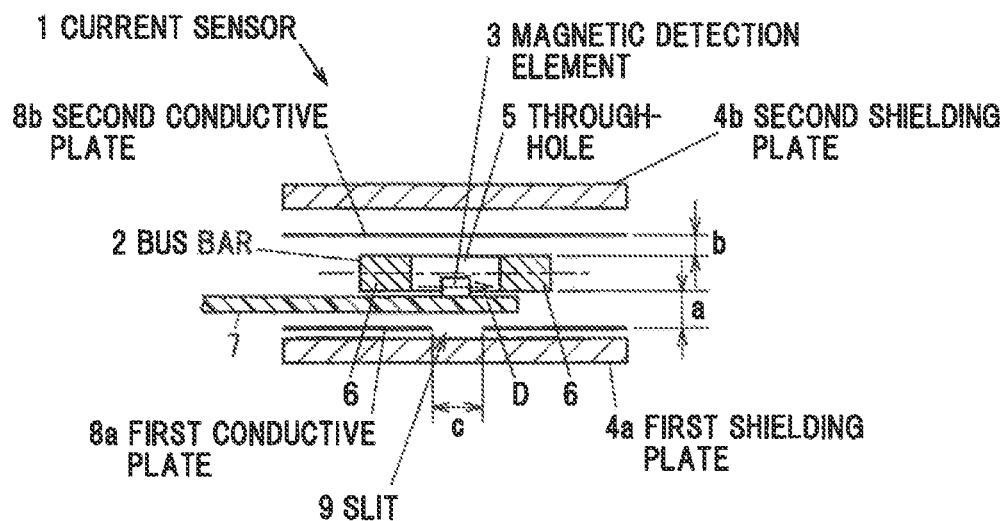
FIG. 1B is a cross sectional view showing the current sensor in the embodiment according to the present invention cut along line A-A in FIG. 1A.

FIG. 1A is a perspective view showing a current sensor in the present embodiment. FIG. 1B is a cross sectional view showing the current sensor in the present embodiment cut along the line A-A in FIG. 1A.

As shown in FIGS. 1A and 1B, a current sensor 1 comprises a bus bar 2 through which electric current as a measuring object flows, a magnetic detection element 3 that detects an intensity of magnetic field generated by the electric current flowing through the bus bar 2, and first and second shielding plates 4a, 4b that are arranged so as to sandwich the bus bar 2 by the first and second shielding plates 4a, 4b in a thickness direction of the bus bar 2.

The bus bar 2 is a plate-like conductor made of electrical good conductor such as copper and aluminum. The bus bar 2 serves as a current path through which the current flows. For example, the bus bar 2 is used for a power supply line between a motor and an inverter in electrical vehicles or hybrid vehicles. For example, the electric current flows through the bus bar 2 at 200 A (amperes) in the steady state. Further, the electric current flows through the bus bar 2 as inrush current is a maximum of about 800 A (amperes) in abnormal case etc. For example, a current frequency is not more than 100 kHz. In the present embodiment, the current flows along the longitudinal direction of the bus bar 2.

The magnetic detection element 3 is configured so as to output a voltage output signal corresponding to the magnetic field intensity (the magnetic flux density) along a detection axis D. In the present embodiment, a giant magnetoresistance (GMR) sensor having high sensitivity is used as the magnetic detection element 3.

The shielding plates 4a, 4b are used to shield against the magnetic field from the outside so as not to affect the detection result of the magnetic detection element 3. In the present embodiment, the shielding plates 4a, 4b are made of a conductive magnetic material such as ferrosilicon, or permalloy. Meanwhile, the shielding plates 4a, 4b may be made of nonconductive magnetic material such as ferrite. In this case, the shielding plates 4a, 4b may not have enough shielding effect in measuring large current, since the nonconductive magnetic material has saturated magnetic flux density which is lower than that of the conductive magnetic material. The saturated magnetic flux density can be kept large so that enough shielding effect can be obtained in measuring the large current by using the conductive magnetic material as the shielding plates 4a, 4b. The first shielding plate 4a is arranged in a downstream side of the bus bar 2 shown in FIGS. 1A, 1B, and the second shielding plate 4b is arranged in an upstream side of the bus bar 2 as shown in FIG. 1A, 1B.

Both the shielding plates 4a, 4b are arranged so as to sandwich the bus bar 2 by both the shielding plates 4a, 4b in the thickness direction to be spaced from the bus bar 2. Moreover, both the shielding plates 4a, 4b are arranged such that surfaces of the shielding plates 4a, 4b are parallel to a surface of the bus bar 2 (such that a normal direction in the surfaces of the shielding plates 4a, 4b corresponds to the thickness direction of the bus bar 2). Meanwhile, both the shielding plates 4a, 4b may not be strictly parallel to the bus bar 2. Some margins is tolerated. Specifically, an angle between the surfaces of the shielding plates 4a, 4b and the surface of the bus bar 2 should be not more than 10°.

In the present embodiment, a distance between the first shielding plate 4a and the bus bar 2 (the distance along the thickness direction) is equal to a distance between the second shielding plate 4b and the bus bar 2 (the distance along the thickness direction). That is, in the present embodiment, both the shielding plates 4a, 4b are arranged to be equidistant from the bus bar 2 and are symmetrically arranged from the center of the bus bar 2 in the thickness direction. Meanwhile, the distances from the bus bar 2 to both the shielding plates 4a, 4b may not be strictly equal. Some margins are tolerated. Specifically, the difference between the distances from the bus bar 2 to both the shielding plates 4a, 4b should be not more than 10% of the distance from the bus bar 2 to the shielding plate 4a (or 4b) that is arranged farther than the bus bar 2.

In the present embodiment, a through-hole 5 is formed in the bus bar 2. The through-hole 5 is formed so as to pierce the bus bar 2. The bus bar 2 surrounds the through-hole 5. That is, the through-hole 5 is not formed in a notch shape that partly opens at a side surface of the bus bar 2. When the through-hole 5 is formed, a current path 6 is formed at both sides of the through-hole 5.

In the present embodiment, the through-hole 5 is formed at an intermediate portion of the bus bar 2 in a width direction. The current path 6 formed at both sides of the through-hole 5 is formed in the same width.

The magnetic fields generated in both current paths 6 cancels each other in the through-hole 5. That is, the magnetic field intensity in the through-hole 5 and nearby the through-hole 5 can decrease by forming the through-hole 5.

In the present embodiment, the magnetic detection element 3 is arranged at an overlapping position with the through-hole 5 in the thickness direction of the bus bar 2. That is, the magnetic detection element 3 is arranged at the overlapping position with the through-hole 5 in a plan view viewed from one side of the thickness direction of the bus bar 2. Meanwhile, "the magnetic detection element 3 is arranged at an overlapping position with the through-hole 5 in the thickness direction of the bus bar 2" means that at least a part of the magnetic detection element 3 is arranged at the overlapping position with the through-hole 5 in the plan view viewed from the upper side (or the lower side) shown in FIG. 1B. For example, it also includes the case of arranging only part of the magnetic detection element 3 at the overlapping position with the through-hole 5 in the plan view. In the cross sectional view shown in FIG. 1B, the part of the magnetic detection element 3 may be arranged in the through-hole 5, or whole of the magnetic detection element 3 may be arranged at an outside of the through-hole 5 (above the through-hole 5). Furthermore, in the present embodiment, the magnetic detection element 3 is arranged between both the shielding plates 4a, 4b to be spaced from both the shielding plates 4a, 4b.

The magnetic field detected by the magnetic detection element 3 can be reduced by forming the through-hole 5 in the bus bar 2 and arranging the magnetic detection element 3 at the overlapping position with the through-hole 5 in the thickness direction of the bus bar 2 even though the large current flows in the bus bar 2.

The magnetic detection element 3 is mounted on a substrate 7. The substrate 7 is made from resin such as glass epoxy. The magnetic detection element 3 is arranged at the overlapping position with the through-hole 5 in the plan view by inserting the substrate 7 between the bus bar 2 and the first shielding plate 4a.

The magnetic detection element 3 is arranged at a first shielding plate 4a-side from the center of the bus bar 2 in the thickness direction (a first conductive plate 8a-side that will be described below). Meanwhile, the part of the magnetic detection element 3 may overlap with the center of the bus bar 2 in the thickness direction. That is, "The magnetic detection element 3 is arranged at a first shielding plate 4a-side from the center of the bus bar 2 in the thickness direction (the first conductive plate 8a-side)" means that the center of the magnetic detection element 3 in the thickness direction is arranged at the first shielding plate 4a-side from the center of the bus bar 2 in the thickness direction.

In the GMR sensor used as the magnetic detection element 3, the detection axis D is parallel to the surface of the substrate 7 that mounts the GMR sensor. In the present embodiment, the magnetic detection element 3 is arranged such that the detection axis D is parallel to the width direction of the bus bar 2. Although the magnetic detection element 3 may be arranged such that the detection axis D is parallel to the thickness direction of the bus bar 2, in such case, the magnetic detection element 3 should be mounted in a beat part where a tip end of the substrate 7 that is bent in 90°. In such case, the structure of the current sensor 1 becomes complicated.

Mold resin (not shown) fills a space between both the shielding plates 4a, 4b. Both the shielding plates 4a, 4b, the magnetic detection element 3, the bus bar 2, and the substrate 7 are integrally constituted as one piece by the mold resin. The mold resin serves reducing the detection error caused by vibration etc. by keeping the positions of the magnetic detection element 3, the bus bar 2, and the both shielding plates 4a, 4b stately. And the mold resin serves reducing the detection error caused by entering a foreign material between the shielding plates 4a, 4b.

(Explanation of the First Conductive Plate 8a and the Second Conductive Plate 8b)

The current sensor 1 according to the present embodiment comprises the first conductive plate 8 made of a conductive nonmagnetic material, and arranged between the bus bar 2 and the first shielding plate 4a, and the second conductive plate 8b made of the conductive nonmagnetic material, and arranged between the bus bar 2 and the second shielding plate 4b.

The conductive plates 8a, 8b are plate (foil) members made of the conductive nonmagnetic material. The conductive plates 8a, 8b are arranged so as to be parallel to the shielding plates 4a, 4b and the bus bar 2. Meanwhile, the conductive plates 8a, 8b may not be strictly parallel to the shielding plates 4a, 4b and the bus bar 2. Some margins are tolerated. Specifically, an angle between the surface of the conductive plates 8a, 8b and the surface of the shielding plates 4a, 4b (or the surface of the bus bar 2) should be not more than 100.

For example, copper or aluminum can be used as the conductive nonmagnetic material forming the conductive plates 8a, 8b. Using the nonmagnetic material as both the conductive plates 8a, 8b can reduce magnetic effect caused by arranging both the conductive plates 8a, 8b. And both the conductive plates a, 8b can be arranged without changing a magnetic layout (a shield layout).

In the current sensor 1, the magnetic detection element 3 is arranged at a first conductive plate 8a-side from the center of the bus bar 2 in the thickness direction (the lower side shown in FIG. 1A, 1B) and the distance a between the first conductive plate 8a and the bus bar 2 (the distance along the thickness direction) is longer than the distance b between the second conductive plate 8b and the bus bar 2 (the distance along the thickness direction). That is, in the current sensor 1, the distance a between the bus bar 2 and the first conductive plate 8a that is arranged at the side where the magnetic detection element 3 is arranged (the lower side shown in FIGS. 1A, 1B) from the center of the bus bar 2 in the thickness direction is longer than the distance b between the bus bar 2 and the second conductive plate 8b that is arranged at an opposite side (the upper side shown in FIG. 1A, 1B). Both the conductive plates 8a, 8b are arranged in asymmetry with respect to the center of the bus bar 2 in the thickness direction.

In the present embodiment, the distances between both the shielding plates 4a, 4b and the bus bar 2 are equal. Thus, the distance between the first conductive plate 8a and the first shielding plate 4a (the distance along the thickness direction) is shorter than the distance between the second conductive plate 8b and the second shielding plate 4b (the distance along the thickness direction).

In the current sensor 1, the first conductive plate 8a comprises a slit 9 formed in the first conductive plate 8a where the magnetic detection element 3 overlaps, and pierces the first conductive plate 8a in the thickness direction. That is, in the current sensor 1, the first conductive plate 8a that comprises the slit 9 is arranged between the bus bar 2 and the first shielding plate 4a. And the second conductive plate 8b that does not comprise the slit 9 is arranged between the bus bar 2 and the second shielding plate 4b.

The slit 9 is formed at the overlapping position with the magnetic detection element 3 in the plan view viewed from one of the thickness direction of the bus bar 2 (the upper or lower direction shown in FIG. 1B). Meanwhile, at least part of the slit 9 should be formed at the overlapping position with the magnetic detection element 3. Only part of the slit 9 may be arranged at the overlapping position with the magnetic detection element 3 in the plan view.

In the present embodiment, although the slit 9 is formed larger than the magnetic detection element 3 in the plan view, and the width c of the slit 9 is larger than the size of the magnetic detection element 3, the size of the slit 9 (the width c) can be aligned corresponding to the distances a, b between both the conductive planes 8a, 8b and the bus bar 2. The size of the slit 9 (the width c) may be less than the size of the magnetic detection element 3.

The slit 9 is formed so as to pierce the first conductive plate 8a. The slit 9 is surrounded by the first conductive plate 8a. In the present embodiment, a square shaped slit 9 whose length of a side is c in the plan view is formed. However, the shape of the slit 9 is not limited thereto. For example, the slit 9 may be formed circularly in the plan view. Moreover, a part of the slit 9 may be formed in a notched-shape opening that opens at the side surface of the first conductive plate 8a.

The thicknesses of the first conduction plate a and the second conductive plate 8b should be not more than a depth of the penetration in the maximum frequency of the current flowing the bus bar 2 for the materials that configures the first conductive plate 8a and the second conductive plate 8b. Hereby, skin effect caused by eddy current induced by the first conductive plate a and the second conductive plate 8b decreases, and frequency dependency can decrease. In the present embodiment, the first conductive plate as and the second conductive plate 8b made of copper with thicknesses in 0.1 mm are used under the condition that the frequency of the current flowing in the bus bar 2 is not more than 100 kHz.

The resin mold (not shown) covers both the conductive plates 8a, 8b with the bus bar 2, the shielding plates 4a, 4b, the magnetic detection element 3, and the substrate 7. The resin mold holds both the conductive plates 8a, 8b at a predetermined position.

(Explanation of the Frequency Dependency in the Current Sensor 1)

Figure 2:
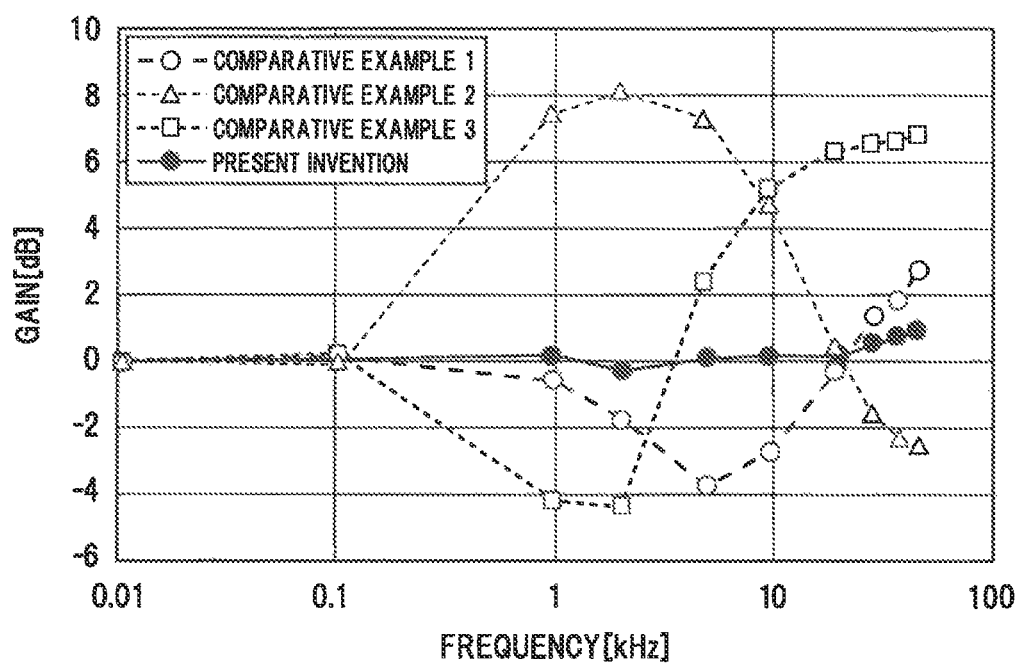
FIG. 2 is a graph showing frequency dependency of the current sensor shown in FIG. 1A and comparative examples.

Next, the frequency dependency in the current sensor 1 according to the present embodiment will be described below with reference to FIG. 2. "Gain" in the vertical axis shown in FIG. 2 means the magnetic flux density detected by the magnetic detection element 3. The magnetic flux density at the frequency in 0.01 kHz defines 0 dB.

Firstly, an example in which the conductive plates La, 8b are omitted (the comparative example 1) from the embodiment shown in FIGS. 1A, 1B will be explained. As shown in FIG. 2, in the comparative example 1 in which the conductive plates La, 8b are omitted, as the frequency of the current flowing in the bus bar 2 gradually increases, the gain decreases caused by the skin effect, and then the gain increases caused by the eddy current generated in the conductive shielding plates 4a, 4b. As described above, the frequency dependency in the magnetic field intensity detected by the magnetic detection element 3 increases caused by the eddy current generated in the shielding plates 4a, 4b when the shielding plates 4a, 4b made of the conductive magnetic materials are used so as to obtain the electromagnetic shielding ability.

Secondly, another example in which the slit 9 is omitted (c=0) from the present embodiment shown in FIGS. 1A, 1B, and the distance a between the first conductive plate 8a and the bus bar 2 becomes longer than the distance b between the second conductive plate 8b and the bus bar 2 (the comparative example 2) will be explained. As shown in FIG. 2, in the comparative example 2, the magnetic field distribution becomes asymmetry in high frequency since the eddy current generated in the second conductive plate 8b has a huge effect more than the eddy current generated in the first conductive plate La while the center of the bus bar 2 in the thickness direction is a reference point. As the result, increasing the gain in the high frequency is controlled in the comparative example 2. For further details, as the frequency of the current flowing in the bus bar 2 gradually increases, the gain increases in the frequency between about 0.1 to 10 kHz, and the gain decreases in the frequency in not less than 10 kHz.

Finally, the other example in which the distances a, b between the both conductive plates 8a, 8b and the bus bar 2 are equal, and the slit 9 is formed in the first conductive plate 8a (the comparative example 3) shown in FIGS. 1A, 1B will be explained. As shown in FIG. 2, in the comparative example 3, which is contrary to the above comparative example 2, the inventors finds that the gain decreases in the frequency between about 0.1 to several kHz, and then the gain increases in the frequency higher than the below frequency as the frequency of the current flowing in the bus bar 2 gradually increases. It is not obvious to cause such frequency character. It may be caused by failing to generate the eddy current at the position where the slit 9 is formed.

The current sensor 1 according to the present embodiment reduces the frequency dependency by combining the structure in the comparative example 2 (the distance a is longer than the distance b) and the structure in the comparative example 3 (forming the slit 9). As shown in FIG. 2, the current sensor 1 (the present invention) that comprises the distance a longer than the distance b, and the slit 9 has less change in the gain, and reduces the frequency dependency even though the frequency of the current flowing in the bus bar 2 changes.

In the current sensor 1, the frequency dependency can be adjusted by the distances a, b between both the conductive plates 8a, 8b and the bus bar 2, and the size of the slit 9 (the width c). The distances a, b between both the conductive plates 8a, 8b and the width c of the slit 9 are adjusted at the value in which the frequency dependency can be most effectively controlled.

(Variation)

In the above embodiment, although the example in which the current sensor has single bus bar 2 as a current detecting object is explained, this invention can be applied to the current sensor that has a plurality of bus bars 2 as the current detecting object.

For example, in a current sensor 31 shown in FIGS. 3A, 3B, when the current sensor 31 comprises three bus bars 2 as the current detecting object, respective bus bars 2 may be preferably arranged in order on the same plane (i.e. coplanarly), common shielding plates 4a, 4b may be preferably arranged so as to sandwich all the bus bars 2 between the common shielding plates 4a, 4b, a common first conductive plate 8a may be preferably arranged between each bus bar 2 and the first shielding plate 4a, and a common second conductive plate 8b may be preferably arranged between each bus bar 2 and the second shielding plate 4b. In such case, the magnetic detection elements 3 that correspond to respective bus bars 2 are respectively arranged at the overlapping position with the through-holes S in the respective bus bars 2 in the plan view, at a position which is deviated to the first shielding plate 4a-side (the first conductive plate 8a-side) from the center of the bus bar 2 in the thickness direction. Arranging the through-holes S of respective bus bars 2 on the same line in the width direction, a plurality of magnetic detection elements 3 (in this case, three magnetic detection elements) corresponding to respective bus bars 2 can be mounted on the common substrate 7. Thus, the current sensor 1 can detect the current flowing in the plurality of bus bars 2 using a simple structure. For example, the current flowing in each bus bar 2 may be the three phase alternative current (U-phase, V-phase, and W-phase) that is transmitted between the invertors and the motors.

Although the current sensor 31 comprises the slits 9 each having an equal width c, corresponding to each bus bar 2, the widths c of the slits 9 may be different from each other. Although the common conductive plates 8a, 8b are arranged above each bus bar 2 in the current sensor 31, the present invention is not limited thereto. Individual conductive plates 8a, 8b may be provided for each bus bar 2. Meanwhile, if the individual conductive plates 8a, 8b are provided for each bus bar 2, the accuracy of positions where the conductive plates 8a, 8b are arranged may be decreased. It is preferable to arrange the common conductive plates 8a, 8b for each bus bar 2 from point of the view in easy manufacturing. In FIG. 3A, although the size of the shielding plates 4a, 4b and the size of the conductive plates 8a, 8b are the same in the plan view, the size of the shielding plates 4a, 4b and the size of the conductive plates 8a, 8b may be different from each other. For example, the conductive plates 8a, 8b may be smaller than the shielding plates 4a, 4b.

Advantageous Effects of the Embodiment

As described above, the current sensor 1 in the present embodiment comprises, the first conductive plate 8a made of the conductive nonmagnetic material, and arranged between the bus bar 2 and the first shielding plate 4a, and the second conductive plate 8b made of the conductive nonmagnetic material, and arranged between the bus bar 2 and the second shielding plate 4b. Also, the magnetic detection element 3 is arranged in the first conductive plate 8a-side from the center of the bus bar 2 in the thickness direction. The distance a between the first conductive plate 8a and the bus bar 2 is longer than the distance b between the second conductive plate 8b and the bus bar 2. The first conductive plate a comprises the slit 9 formed in the first conductive plate 8a at a position which overlaps with the magnetic detection element 3 in the thickness direction, and the slit 9 pierces the first conductive plate 8a in the thickness direction.

The frequency dependency can be decreased by adjusting the distances a, b between the conductive plates 8a, 8b and the bus bar 2, and the width c of the slit 9 even in the case of using the shielding plates 4a, 4b made of the conductive magnetic material. That is, in the present embodiment, it is possible to provide the current sensor 1 which reduces the frequency dependency in the magnetic flux density detected by the magnetic detection element 3 without decreasing the electromagnetic shielding ability.

In the current sensor 1, since the conductive plates 84, 8b is thinner than the depth of the penetration at the maximum frequency of the current flowing in the bus bar 2 in the material configuring the conductive plates 8a, 8b, the skin effect caused by the eddy current in the conductive plates 8a, 8b can be decreased. Thus, the current sensor 1 that further improves, i.e. reduces the frequency dependency can be provided.

Moreover, in the current sensor 1, the through-hole 5 that pierces the bus bar 2 is formed in the bus bar 2, the current path 6 is formed at both sides of the through-hole 5, and the magnetic detection element 3 is arranged at the overlapping position with the through-hole 5 in the thickness direction of the bus bar 2. Thus, for example, even though the electric current as the measuring object is large such as the electric current transmitted between the motor and the invertor, the magnetic detection element 3 having high accuracy of the sensitivity such as GMR sensor can be used. Therefore, the current can be detected with high sensitively. That is, according to the present embodiment, it is possible to provide the current sensor 1 that has high accuracy of the sensitivity and can detect the large current.

Summary of the Embodiment

Next, technical ideas understood from the embodiments as described above will be described below with using the reference numerals, etc., used in the description of the embodiments. However, each reference numeral, etc., described below is not intended to limit the constituent elements in the claims to the members, etc., specifically described in the embodiments.

[1] A current sensor (1), comprising:
a bus bar (2) through which a current as a measuring object flows;
a magnetic detection element (3) that detects a magnetic field intensity generated by the current flowing in the bus bar (2);
first and second shielding plates (4a, 4b) arranged so as to sandwich the bus bar (2) between the first and second shielding plates (4a, 4b) in a thickness direction of the bus bar (2);
a first conductive plate (8a) comprising a conductive nonmagnetic material, and arranged between the bus bar (2) and the first shielding plate (4a); and
a second conductive plate (8b) comprising the conductive nonmagnetic material, and arranged between the bus bar (2) and the second shielding plate (4b),
wherein the magnetic detection element (3) is arranged closer to a first conductive plate (8a) than a center of the bus bar (2) in the thickness direction,
wherein a distance between the first conductive plate (8a) and the bus bar (2) is longer than a distance between the second conductive plate (8b) and the bus bar (2), and
wherein the first conductive plate (8a) comprises a slit (9) formed in the first conductive plate (8a) at an overlapping position with the magnetic detection element (3) in the thickness direction, and pierces the first conductive plate (8a) in a thickness direction of the first conductive plate (8a).

[2] The current sensor (1) according to [1], wherein the first conductive plate (8a) and the second conductive plate (8b) are thinner than a depth of a penetration at a maximum frequency of the current flowing in the bus bar (2) in a material that configures the first conductive plate (8a) and the second conductive plate (8b).

[3] The current sensor (1) according to [1] or [2], wherein the first and second shielding plates (4a, 4b) comprise a conductive magnetic material.

[4] The current sensor (1) according to any one of [1] to [3], wherein the distance between the first shielding plate (4a) and the bus bar (2) is equal to the distance between the second shielding plate (4b) and the bus bar (2).

[5] The current sensor (1) according to any one of [1] to [4], wherein a through-hole (5) that pierces the bus bar (2) is formed, and current paths (6) are formed at both sides of the through-hole (5), and
wherein the magnetic detection element (3) is arranged at an overlapping position with the through-hole (5) in a thickness direction of the bus bar (2).

[6] The current sensor (1) according to [5], wherein the magnetic detection element (3) is a GMR sensor.

[7] The current sensor (31) according to any one of [1] to [6], comprising:
a plurality of bus bars (2); and
a plurality of magnetic detection elements (3) corresponding to the plurality of bus bars (2),
wherein the plurality of bus ban (2) are arranged in order on a same plane, and
wherein the first and second shielding plates (4a, 4b) are arranged so as to sandwich all the plurality of bus bars (2) between the first and second shielding plates (4a, 4b).

[8] The current sensor (31) according to [7], wherein the first conductive plate (3a) that is common in the plurality of bus bars (2) is arranged between the plurality of bus bars (2) and the first shielding plate (4a), and
wherein the second conductive plate (8b) that is common in the plurality of bus bars (2) is arranged between the plurality of bus bars (2) and the second shielding plate (4b).

Although, the embodiments of the invention have been described, the invention is not to be limited to the embodiments. Meanwhile, it should be noted that all combinations of the features described in the embodiments are not necessary to solve the problem of the invention.

Also, the various kinds of modifications can be implemented without departing from the gist of the invention.

For example, although the case of using the GMR sensor as the magnetic detection sensor 3 is explained in the above embodiment, the present invention is not limited thereto. Other elements such as an Anisotropic Magneto Resistive (AMR) sensor, a Tunneling Magneto Resistive (TMR) sensor, and a Hall IC can be used as the magnetic detection sensor 3. Meanwhile, if possible, it is preferable to use the magnetic detection element 3 having high accuracy of the sensitivity so as to provide current detection with the high accuracy.

Also, although the case of using single magnetic detection element 3 is explained in the above embodiment, the present invention is not limited thereto. The current may be detected on the basis of outputs from the plurality of magnetic detection elements 3 by arranging the plurality of magnetic detection elements 3 (for example, two magnetic detection elements 3) at the overlapping position with the thorough hole 5 in the plan view.

Furthermore, in the above embodiment, although the through-hole 5 is formed at the intermediate portion of the bus bar 2 in the width direction, the through-hole 5 may be formed at the position which is deviated from the intermediate portion of the bus bar 2 in the width direction. That is, the widths of current paths 6 at both the sides of the through-hole 5 may be different respectively.

What is claimed is:

1. current sensor, comprising:
a bus bar through which a current as a measuring object flows;
a magnetic detection element that detects a magnetic field intensity generated by the current flowing in the bus bar;
first and second shielding plates arranged so as to sandwich the bus bar between the first and second shielding plates in a thickness direction of the bus bar;
a first conductive plate comprising a conductive nonmagnetic material, and arranged between the bus bar and the first shielding plate; and
a second conductive plate comprising the conductive nonmagnetic material, and arranged between the bus bar and the second shielding plate,
wherein the magnetic detection element is arranged closer to the first conductive plate with respect to a center of the bus bar in the thickness direction,
wherein a distance between the first conductive plate and the bus bar is longer than a distance between the second conductive plate and the bus bar, and
wherein the first conductive plate comprises a slit formed in the first conductive plate at an overlapping position with the magnetic detection element in the thickness direction, and pierces the first conductive plate in a thickness direction of the first conductive plate.

2. The current sensor according to claim 1, wherein the first conductive plate and the second conductive plate are thinner than a depth of a penetration at a maximum frequency of the current flowing in the bus bar in a material that configures the first conductive plate and the second conductive plate.

3. The current sensor according to claim 1, wherein the first and second shielding plates comprise a conductive magnetic material.

4. The current sensor according to claim 1, wherein the distance between the first shielding plate and the bus bar is equal to the distance between the second shielding plate and the bus bar.

5. The current sensor according to claim 1, wherein a through-hole that pierces the bus bar is formed, and current paths are formed at both sides of the through-hole, and
   wherein the magnetic detection element is arranged at an overlapping position with the through-hole in a thickness direction of the bus bar.

6. The current sensor according to claim 5, wherein the magnetic detection element comprises a GMR sensor.

7. The current sensor according to claim 1, comprising:
a plurality of bus bars; and
a plurality of magnetic detection elements corresponding to the plurality of bus bars,
wherein the plurality of bus bars are arranged in order on a same plane, and
wherein the first and second shielding plates are arranged so as to sandwich all the plurality of bus bars between the first and second shielding plates.

8. The current sensor according to claim 7, wherein the first conductive plate that is common in the plurality of bus bars is arranged between the plurality of bus bars and the first shielding plate, and
   wherein the second conductive plate that is common in the plurality of bus bars is arranged between the plurality of bus bars and the second shielding plate.

\* \* \* \* \*